(12) United States Patent
Dellis et al.

(10) Patent No.: US 10,859,980 B2
(45) Date of Patent: Dec. 8, 2020

(54) MOLECULAR ATOMIC CLOCK WITH WAVE PROPAGATING ROTATIONAL SPECTROSCOPY CELL

(71) Applicant: Texas Instruments Incorporated, Dallas, TX (US)

(72) Inventors: Argyrios Dellis, Dallas, TX (US); Juan Alejandro Herbsommer, Allen, TX (US); Adam Joseph Fruehling, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/234,499

(22) Filed: Dec. 27, 2018

(65) Prior Publication Data

US 2019/0204788 A1   Jul. 4, 2019

Related U.S. Application Data

(60) Provisional application No. 62/612,121, filed on Dec. 29, 2017.

(51) Int. Cl.
*H03L 7/26* (2006.01)
*H03B 17/00* (2006.01)
*G04F 5/14* (2006.01)

(52) U.S. Cl.
CPC ............... *G04F 5/14* (2013.01); *H03B 17/00* (2013.01); *H03L 7/26* (2013.01)

(58) Field of Classification Search
CPC .......... G04F 5/14; G04F 5/145; H03B 17/00; H03L 7/26

USPC .................................................... 331/3, 94.1
See application file for complete search history.

(56) References Cited

U.S. PATENT DOCUMENTS

| 2,995,711 | A | * | 8/1961 | Peter | H01S 1/06 |
| | | | | | 330/4 |
| 4,943,955 | A | | 7/1990 | Rabian et al. | |
| 5,148,437 | A | * | 9/1992 | Ohtsu | G04F 5/14 |
| | | | | | 331/3 |
| 5,327,105 | A | | 7/1994 | Liberman et al. | |
| 2011/0187464 | A1 | * | 8/2011 | Youngner | G04F 5/14 |
| | | | | | 331/94.1 |
| 2013/0176080 | A1 | * | 7/2013 | Nishida | G04F 5/145 |
| | | | | | 331/94.1 |
| 2015/0028866 | A1 | | 1/2015 | Parsa et al. | |
| 2016/0291549 | A1 | * | 10/2016 | Herbsommer | G01N 29/36 |

FOREIGN PATENT DOCUMENTS

RU      2554358 C1    6/2015

OTHER PUBLICATIONS

International Search Report for PCT/US2018/068180 dated Apr. 25, 2019.

* cited by examiner

*Primary Examiner* — Levi Gannon
(74) *Attorney, Agent, or Firm* — Michael A. Davis, Jr.; Charles A. Brill; Frank D. Cimino (57) ABSTRACT

A clock apparatus with a gas cell. The gas cell includes: (i) a first chamber including a sealed interior for providing a signal waveguide; and (ii) a second chamber, in fluid communication with the first chamber, and comprising apparatus for directing atoms having a selected velocity vector into the first chamber.

18 Claims, 4 Drawing Sheets

MOLECULAR ATOMIC CLOCK WITH WAVE PROPAGATING ROTATIONAL SPECTROSCOPY CELL

CROSS-REFERENCES TO RELATED APPLICATIONS

This application claims priority to, the benefit of the filing date of, and hereby incorporates herein by reference: U.S. Provisional Patent Application No. 62/612,121, entitled "Molecular Atomic Clock With Wave Propagating Rotational Spectroscopy Cell," filed Dec. 29, 2017.

STATEMENT REGARDING FEDERALLY SPONSORED RESEARCH OR DEVELOPMENT

Not Applicable.

BACKGROUND

The example embodiments relate to precision frequency clock signals generated from molecular rotational quantum response in a cell and, more particularly, to a system incorporating wave interrogation of the cell.

Precision clock signals, usable as a base frequency source either directly, or converted (e.g., divided down) to some multiple of a base frequency source, can be generated from various circuits and configurations. One precision clock signal example is an atomic clock, so named as its signal is produced in response to the natural and quantum response of atoms or molecules, to an excitation source. In one approach, such atoms are in the form of alkali metals stored in a chamber, where the excitation source can be one or more lasers directed to the cell and the response of the chamber atoms is detected by measuring the amount of laser energy (photons) that passes through the chamber as the laser frequency sweeps across a range. In another approach, such molecules are in the form of dipolar gases also stored in a chamber, where the excitation source is an electromagnetic wave propagating through the chamber and the response of the chamber atoms is detected by measuring the amount of electromagnetic energy that passes through the chamber as the energy source sweeps across a range.

Further to the above, an example of a millimeter wave atomic clock is described in U.S. Pat. No. 9,529,334 ("the '334 patent"), issued Dec. 27, 2016, hereby incorporated fully herein by reference, and which is co-assigned to the same assignee as the present application. The '334 patent illustrates, among various other things, an atomic clock apparatus including a sealed cavity storing a dipolar gas, with an electromagnetic entrance into which an electromagnetic wave (or field) enters near a first end of the cavity and an electromagnetic exit from which an electromagnetic wave exits near a second end of the cavity. The electromagnetic wave that so exits is measured to determine an amount of absorption by (or transmission through) the dipolar gas, with the measure indicative of the quantum response of the gas as a function of the wave frequency of the wave. The '334 patent also discusses a selection of pressure for the cavity-sealed dipolar gas, noting that pressure reduction below a desired pressure would reduce the magnitude of the peak response transition, thereby degrading the ability to detect and track the quantum response of the dipolar gas.

While the prior art approaches described above can provide useful to quantum response detection, the present application provides alternatives to the prior art, as further detailed below.

SUMMARY

In an embodiment, there is a clock apparatus with a gas cell. The gas cell comprises: (i) a first chamber including a sealed interior for providing a signal waveguide; and (ii) a second chamber, in fluid communication with the first chamber, and comprising apparatus for directing atoms having a selected velocity vector into the first chamber.

Numerous other inventive aspects are also disclosed and claimed.

DETAILED DESCRIPTION

Figure 1:
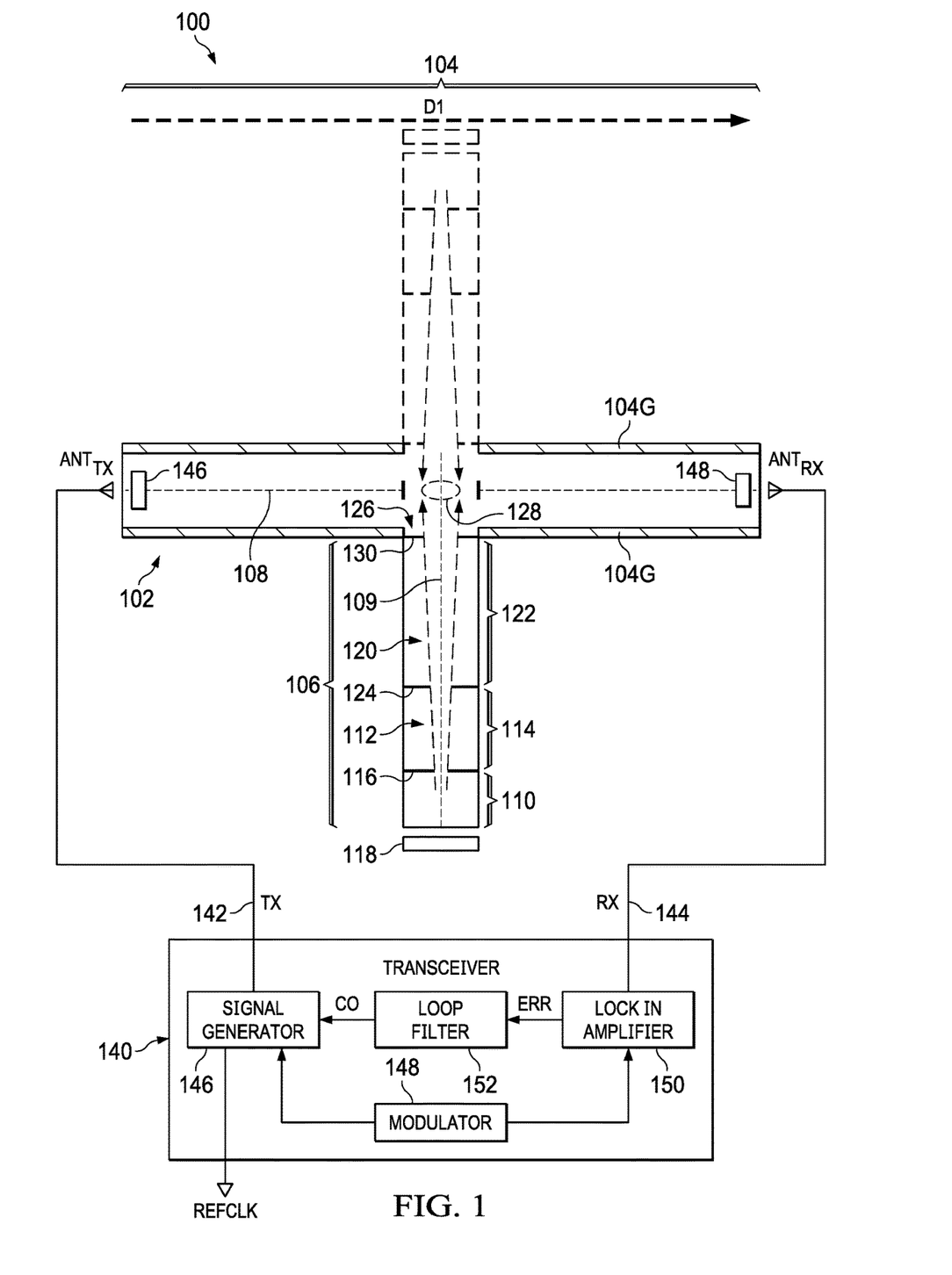
FIG. 1 illustrates a schematic and perspective diagram of an example embodiment clock system.

FIG. 1 illustrates an electrical block and perspective diagram of an example embodiment clock system 100. Clock system 100 includes a cell 102. Cell 102 includes two different chambers 104 and 106 in fluid communication with each other, and each of chambers 104 and 106 has a respective axis 108 and 109 along the respective majority length of the chamber. Cell 102 also may be formed in connection with an integrated circuit wafer, which can include multiple layers affixed relative to a semiconductor substrate (see, e.g., the incorporated by reference U.S. Pat. No. 9,529,334). In the illustration of FIG. 1, as well as in a subsequent figure, the shape of cell 102 is intended to depict a generally top-down view, such as a planar cross-sectional view parallel to the plane generally defined by the substrate in which the gas storage cavity of cell 102 is formed. In general, cell 102 includes a sealed enclosure having an interior in which a gas is stored. More specifically, cell 102 stores a dipolar gas, such as water vapor or any other dipolar molecular gas or molecules that can be used to create an atomic clock, inside an enclosed cavity of the cell, the cavity being sealed by nature of shapes, layering, and the like relative to the semiconductor substrate and layers that combine to enclose the dipolar gas at a relatively low (e.g., 0.1 mbar) pressure. For reasons detailed below, however, the enclosed pressure can be other than the example provided, as an example embodiment affords additional beneficial results that are independent of, or minimally affected by, the sealed pressure of the dipolar gas.

Regarding additional detail of chamber 104, it is lined along most of its interior surfaces with a material to facilitate the interior as a signal waveguide, where such material may be, for example, a conductor or a dielectric. In addition, optional getter regions 104G may be included along surfaces of chamber 104, so as to adsorb larger concentrations of dipolar gas atoms in chamber 104, as compared to other fluid communicating regions within cell 102.

In an example embodiment, the getter material is selected to ensure that the quantity of getter inside chamber 104 is enough so that preferably getter 104G will not saturate over the lifetime of the device. Accordingly, getter regions 104G collect molecules in the main area of waveguide chamber 104 and also prevent these molecules from bouncing off the walls which otherwise could cause Doppler broadening. Relatedly, and as detailed below, chamber 104 facilitates the propagation of an electromagnetic wave on a path along a direction D1 and, accordingly, generally along axis 108. The cross-sectional shape of chamber 104 perpendicular to axis 108 may be square, rectangular, trapezoidal, or still other shapes. The dimensions of chamber 104 may vary based on various considerations such as matching properties for efficient wave propagation given the frequency of the desired wave, waveguide shape, and the like, so that for example the bandwidth is centered with the desired molecule interrogation frequency (e.g., 183 GHz for water; or 182.4 GHz for carbonyl sulfide (OCS)), or at least such that it is far from the lower cutoff frequency and does not allow the propagation of any higher order modes with some safety margin. Accordingly, a WR5 waveguide (recommended bandwidth of 140-220 GHz) is a good fit for water at 183 GHz, where for example the waveguide may be 30 to 150 mm long (distance of wave travel), and where for a rectangular cross-section in the direction perpendicular to wave propagation, an example aspect ratio is 2:1 for width:height, and so for example in the illustrated example the respective width and height can be 1.2954 mm and 0.6477 mm. Moreover, while the longitudinal shape is linear in FIG. 1, it also may bend or turn so as to form, for example, a meandering path.

Regarding additional detail of chamber 106, it includes a reservoir 110, in which dipolar gas is located, although fluid communication within cell 102 permits such gas to be distributed throughout cell 102. Reservoir 110 is physically bounded in most respects by the boundary of chamber 106 (e.g., sidewalls, top, bottom, and end wall), while one portion of reservoir 110 includes, or fluidly communicates with, a first velocity direction filter 112. As further detailed later, velocity direction filter 112 is intended as an apparatus that filters atoms from among the atoms of the dipolar gas situated in reservoir 110. The filtered (selected) atoms are those having a velocity vector direction aligned, or more closely aligned, with axis 109, relative to other atoms in reservoir 110, and those filter atoms are effectively directed toward an adjacent reservoir 114. In the illustrated example, velocity direction filter 112 is achieved by forming an aperture in a first wall 116 within chamber 106, where the size might vary based on various considerations. For example, the aperture (e.g., diameter) of velocity direction filter 112 may be on the order of 1 mm or less than 1 mm (e.g., 200 µm or less), the exact size of the aperture will be such in order to allow enough molecules to propagate and reach chamber 104 in order to maximize the signal-to-noise ratio (SNR) but also to narrow the distribution of velocities of the molecules so that velocity vector direction is aligned, or more closely aligned, with axis 109. A symmetric structure on the opposite wall of chamber 104 also may be included preferred in order to maintain phase uniformity, as shown in FIG. 1 with a dashed outer boundary. An asymmetric structure is also possible, yet in such an example a preference would be to shift the design dimensions, such as by a factor of $\lambda_g/8$, where $\lambda_g$ is the wavelength in chamber 104. Further, note that chamber 106 may have differing dimensions from chamber 104, as chamber 106 will be herein understood to have a functionality of directing certain atoms into chamber 104, while chamber 104 has a functionality of propagating waves; accordingly, the wave-propagating considerations in the dimensions of chamber 104 need not necessarily apply to chamber 106, so for example chamber 106 may be taller (e.g., greater than 1 mm) so as to support sufficient structure to implement the apertures described herein. Also in connection with advancing atoms through velocity direction filter 112, a heating (or other external energizing) block 118 is located proximate reservoir 110. In one example, heating block 118 includes one or more devices for applying heat to reservoir 110. For example, block 118 may include a heating element (e.g., a resistor, laser, or the like), a controller for applying energy (e.g., current) to the heating element, and additional structure (e.g., feedback loop and thermometer/thermistor) to keep the temperature of reservoir 110 stable or otherwise within some range.

Dipolar gas is also located in reservoir 114, but given its fluid communication with reservoir 110 and velocity direction filter 112 between the two reservoirs, reservoir 114 stores a greater concentration of atoms having a velocity vector direction aligned with axis 109, relative to the velocity distribution of atoms in reservoir 110. Reservoir 114, akin in various respects to reservoir 110, also is physically bounded by the boundary of chamber 106, although as already described includes, or fluidly communicates with, a first velocity direction filter 112 and as now described also includes, or fluidly communicates with, a second velocity direction filter 120. Like velocity direction filter 112, velocity direction filter 120 also filters atoms according to velocity vector direction, but filter 120 selects from among the atoms of the dipolar gas situated in reservoir 114 by filtering selected atoms to pass to an adjacent reservoir 122. Accordingly, velocity direction filter 120 may be achieved using a comparable structure as filter 112, for example by forming an aperture in a second wall 124 within, or in fluid communication with, chamber 114. The aperture of velocity direction filter 120 may be the same as that of filter 112 (on the order of 1 mm), or slightly larger so as to adjust the columnar molecular beam that is accomplished by way of successive filters, each preferably having a respective center concentrically aligned along axis 109.

Dipolar gas is also located in reservoir 122, but given its fluid communication with reservoir 114 and velocity direction filter 120 between the two reservoirs, reservoir 122 stores a greater concentration of atoms having a velocity vector direction aligned with axis 109, relative to the velocity distribution of atoms in reservoir 114. Reservoir 122 is again akin to both reservoirs 110 and 114, physically bounded by parts of the boundary of chamber 106, while part of reservoir 122 also includes, or fluidly communicates with, a third velocity direction filter 126, separating reservoir 122 from a region 128 (shown by a dashed oval in FIG. 1) that fluidly communicates with the wave propagation path along direction D1 and axis 108. Like velocity direction filters 114 and 120, velocity direction filter 126 also filters atoms according to velocity vector direction, but filter 126 does so from among the atoms of the dipolar gas situated in reservoir 122 and using a comparable structure as filters 114 and 120, for example by forming an aperture in a third wall 130 within chamber 106. In a preferred example, third wall 130 is aligned, or closely proximate, with the longitudinal wall of chamber 104, so as to reduce any effect that cavity 106 might have to wave propagation through cavity 104. Further, the aperture of velocity direction filter 126 may be the same as that of filters 112 and 120 (on the order of 1 mm), or again slightly larger so as to adjust the columnar molecular beam that is accomplished by way of successive filters, again each preferably having a respective center concentrically aligned along axis 109.

Clock system 100 also includes a transceiver 140 in connection with transmitting signals to, and receiving signals from, cell 102. Particularly, transceiver 140 has an output 142 connected to provide a transmit signal TX to a transmit antenna $ANT_{TX}$ and an input 144 connected to receive a receive signal RX from a receive antenna $ANT_{RX}$. Transmit antenna $ANT_{TX}$ is positioned proximate a first passage 146 of cell 102, so that electromagnetic energy from transceiver 140 may be communicated to transmit antenna $ANT_{TX}$ and then into first passage 146 as an entrance into cell 102 and thereby to pass in direction D1. Note that the term passage in the context of first passage 146 is intended to suggest a signal communications pathway for passage of the electromagnetic signal, but not an open aperture to ambient per se that otherwise could cause the sealed dipolar gas in cell 102 to escape; accordingly, such a pathway may be formed in various fashions, such as by a glass layer as the upper surface of the volumetric enclosure of the cell and providing an opening in the metal surround that is otherwise formed within the cell—in this manner, an electromagnetic signal may pass through the opening and glass into the interior of cell 102, thereby reaching and interrogating the dipolar gas sealed therein. Moreover, while examples provided herein describe a metal coated waveguide, a contemplated alternative is a substrate integrated waveguide (SIW) in which case the propagated signal is introduced by RF launch. Receive antenna $ANT_{RX}$ is positioned proximate a second passage 148 of cell 102, so that electromagnetic energy that passes along axis 108 may be communicated through passage 148, to receive antenna $ANT_{RX}$, and then to transceiver 140, for signal processing detailed later.

Looking to additional details of transceiver 140, internally illustrated are four blocks 146, 148, 150, and 152, by way of example but not limitation, for accomplishing the transceiver functionality described herein. In this regard, a signal generator 146 is connected, and is modulated by a modulator 148, to provide a base frequency controlled TX signal that is swept across a particular frequency range from below to past the intrinsic quantum rotational state transition frequency for the dipolar gas in cell 12 (e.g., 183.31 GHz for water). Modulator 148 modulates the frequency of the interrogation signal provided by the signal generator 146. The modulation frequency ranges, for example, between 10 to 50 KHz. After the signal passes through the gas cell, it is received by a lock in amplifier 150, via an input 144 coupled to receive the RX signal from receive antenna $ANT_{RX}$. In general, lock in amplifier 150 uses the signal from modulator 148 to measure the RX signal at the same modulation frequency provided by modulator 148. In this way, lock in amplifier 150 is able to reject noise outside the modulation frequency and thereby reduce the noise from the system.

In more detail, the TX signal may be a sinusoid, although other periodic oscillating signals also may be used, so long as such signal includes a Fourier component in the frequency of interest. Under feedback control, signal generator 146 also provides the ultimately-refined reference clock REFCLK. The RX signal represents an amount of the originally transmitted signal TX that passes through cell 102 and contains the information of the absorption of the dipolar gas at the quantum rotations transition frequency. In response, lock in amplifier 150 provides a signal that is the first derivative of the signal as it is swept in frequency. Consequently at the frequency corresponding to the quantum rotational molecular transition, the first derivative is zero and the error signal ERR is zero. At frequencies different from the quantum rotational transition, the signal ERR is not zero and provides a correction to a loop filter 152, allowing it to "lock" the clock to the quantum transition frequency. This apparatus also filters out noise as detected by reference to the modulation frequency provided by modulator 148. In one example, lock in amplifier 150 provides the error signal ERR as an in-phase output, and the error signal ERR is used as an input by loop filter 152 (or controller circuit) for providing a control output signal CO to signal generator 146. Such feedback selectively adjusts the TX output signal frequency, following an initial sweep, to ultimately maintain this frequency at a peak absorption frequency of the dipolar molecular gas inside the sealed interior of cell 102, with that maintained frequency providing a stable output reference clock REFCLK. In some examples, the RF power of the TX and RX loop is controlled so as to avoid or mitigate stark shift effects (frequency shifts in response to quantum transition produced by the presence of an electric field).

Figure 2:
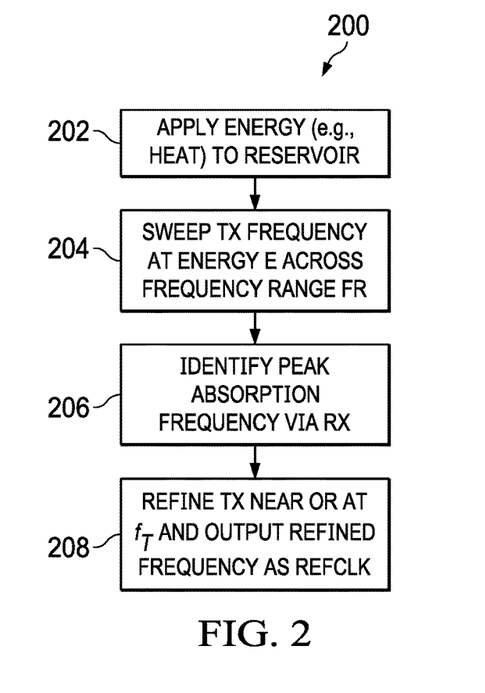
FIG. 2 illustrates a method of operation of the system of FIG. 1.
Figure 3A:
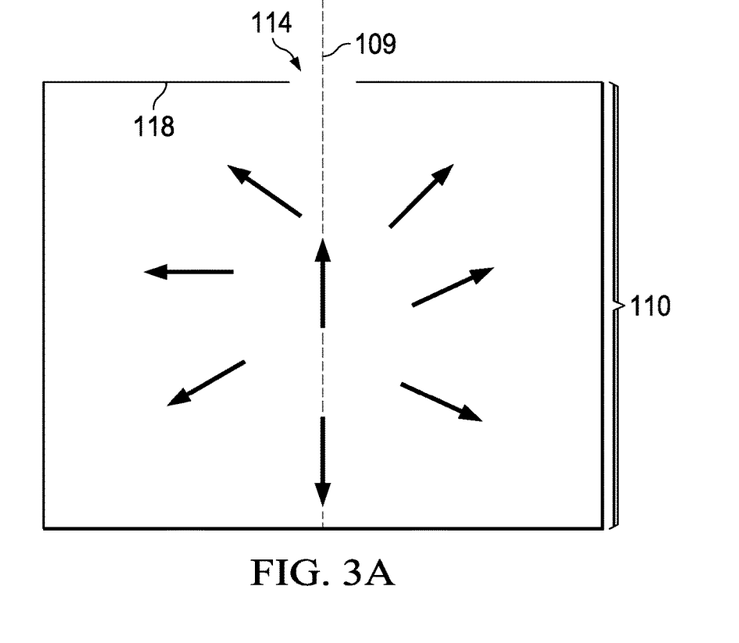
FIG. 3A illustrates a simplified depiction of circles intending to illustrate atoms in a reservoir of an example embodiment clock system.
Figure 3B:
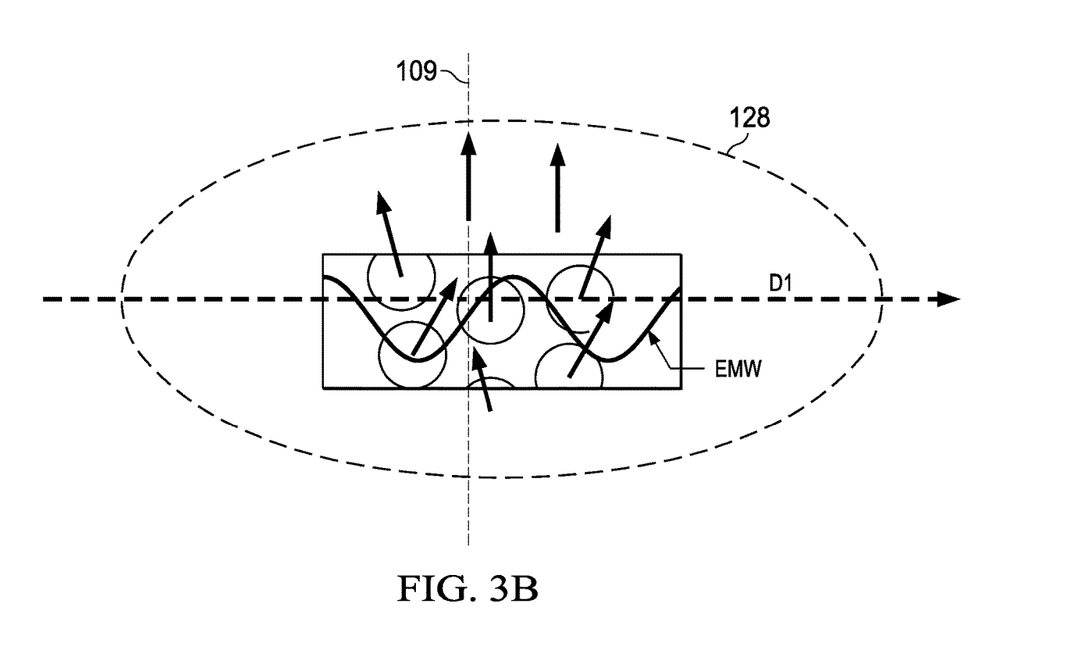
FIG. 3B illustrates a simplified depiction of circles intending to illustrate filtered atoms in an electromagnetic wave propagation path in an example embodiment clock system.

The overall operation of system 100 is now described, in connection with a flow chart method 200 shown in FIG. 2, and further in view of the atomic velocity vector illustrations of FIGS. 3A and 3B. By way of introduction, note that method 200 is shown as a sequential flow process for sake of discussion, while in general the steps provide a feedback control and, accordingly, each step may actually occur in a time overlapping one or more of the other steps.

In a step 202, energy (e.g., heat) is applied by heating block 118 to reservoir 110. More particularly, the atoms of the dipolar gas situated in reservoir 110 will have differing directions of velocity, according to some type of distribution (e.g., isotropic for velocity direction, and Maxwell-Boltzmann distribution for velocity amplitude). In this regard, FIG. 3A illustrates a simplified depiction of circles intending to illustrate atoms in reservoir 110, where each illustrated circle (atom) has a corresponding arrow indicating the velocity vector direction for the atom. Accordingly, given the distribution of atoms, some vector directions will align with or near enough axis 109 to be oriented in the direction of filter 112. In connection with step 202, the additional energy will assist in advancing those aligned (or near-aligned) atoms through filter 112 and to the next adjacent reservoir 114, as shown in FIG. 1. Indeed, also shown in general in FIG. 1 is the advancement of such atoms, which may successively continue through respective velocity direction filters 120 and 126, as shown by dashed arrows forming a wedge to thereby illustrate the columnar molecular beam from reservoir 110 upward to chamber 104, thereby causing a concentration of atoms to position in region 128. In this regard, FIG. 3B illustrates another simplified depiction of circles intending to illustrate atoms using a comparable convention to FIG. 3A, where the FIG. 3B depiction is intended to illustrate a group of atoms in region 128, that is, in the wave propagation path and direction D1 of chamber 104. In FIG. 3B, the successive filtering causes the velocity vector alignment of those atoms in region 128 to be generally much more consistently aligned, or nearly-aligned, relative to axis 109. In other words, a preference is that the achieved FIG. 3B velocity vector population is as close as possible to aligned to axis 109 and no longer has an isotropic direction distribution as was the case in reservoir 110, but achieving such an alignment, via filters 112, 120, and 126, will reduce the number of molecules that are interrogated in region 128, thereby also reducing SNR. One skilled in the art, therefore, will readily consider a tradeoff as between filtering the molecules to align or nearly-align with axis 109 while still advancing a sufficient number of molecules to region 128, so as to provide a sufficient SNR. Further, the general directionality of the velocity vectors in FIG. 3B is perpendicular or near-perpendicular (e.g., within ±45 degrees, or even ±30 degrees or less) to the direction D1 along which the electromagnetic wave EMW propagates through chamber 104. Lastly, inasmuch as the preceding describes advancement of atoms from reservoir 110 toward region 128, alternative example embodiments contemplate manners of providing a sufficient number of molecules for such advancement and for interrogation—accordingly, in one such example, reservoir 110 may be designed and/or populated to initially store more than an adequate supply of molecules to ensure proper operation beyond the expected lifetime of system 100, and in another example a recirculation path/apparatus is included in system 100, which may operate in conjunction with heating block 118, so as to re-supply atoms into reservoir 110.

In a step 204, transceiver 140 sweeps the TX signal across a frequency range FR that is intended to include the intrinsic quantum rotational state transition frequency for the dipolar gas in cell 102. Accordingly, in the example where the dipolar gas is water, the range will include the intrinsic quantum rotational state transition frequency of 183.31 GHz for water, and could include, for example, a sweep from 183.28 GHz to 183.34 GHz. Further, the TX signal delivers an energy to transmit antenna $ANT_{TX}$, sweeping across this frequency range, so that the same frequency is communicated to chamber 104 of cell 102 and so as to propagate along direction D1 and thereby interrogate the dipolar gas atoms therein.

In a step 206, transceiver 140 converges to, or locks in at, a frequency $f_T$ at which peak absorption of the electromagnetic wave occurs in the dipolar gas sealed in cell 102, in response to the sweeping frequency from step 204. Accordingly, in step 206, receive antenna $ANT_{RX}$ couples the RX signal to lock in amplifier 150 of transceiver 140, and note that lock in amplifier 150 also receives the current frequency of TX from signal generator 146. In response, lock in amplifier 150 also provides a frequency differential error signal ERR, representative of the difference between the frequency of the current TX signal and the frequency $f_T$, as determined from the corresponding RX signal, and the error ERR signal is connected as an output to loop filter 152.

In step 208, loop filter 152 provides a control signal CO to signal generator 146, so as to refine control of signal generator 146 to make adjustments in the frequency of TX to restrain or refine that frequency in a feedback look controlled manner to thereafter maintain the base frequency at the peak absorption frequency $f_T$, at which peak absorption occurs of the electromagnetic wave occurs in the cell dipolar gas. In this regard, note that loop filter 152 is preferably a proportional integral derivative (PID) circuit, with an output that sums values, multiplied times respective controlled parameters, corresponding to the three factors (proportional, integral, derivative) that give the PID circuit its name. Accordingly, the output of loop filter 152 facilitates a clock signal with good stability and reduces or eliminates the possibility of the signal generator creating a signal that oscillates around the around desired frequency. Accordingly, at this point, the TX signal should maintain a base frequency at or near the intrinsic transitional quantum frequency of the dipolar gas, and that same base frequency is output as the reference clock signal REFCLK, as may be used by other circuitry requiring a frequency-precise clock signal. Indeed, method 200 may be regarded as an ongoing loop running at selected (or all) times that the clock is operational and endeavoring to lock the clock at most or all instants where, once locked after an initial scan of steps 204 and 206, the loop continues to perform across a second frequency range that is smaller in bandwidth than the above-described step 204 initial frequency range FR, stop where the second frequency range is expected to still include the center frequency representing frequency $f_T$. In other words, the step 204 sweep and step 206 response detection can essentially repeat in step 208, but using a narrower bandwidth for more efficient refinement or maintenance of the base frequency at the peak absorption frequency $f_T$, as further illustrated hereinbelow.

Given the preceding, one skilled in the art will appreciate that system 100 facilitates electromagnetic interrogation of the dipolar gas within cell 102, by transmitting TX at varying frequencies within a defined band around a suspected quantum absorption frequency at which the transmission efficiency of cell 102 is minimal (absorption is maximal), and when the system detects a null or minima in transmission energy (or maximum in absorption), the TX output signal frequency is regulated to operate at the frequency so detected, thereby in response to the natural quantum behavior of the dipole. As a result, REFCLK, like that quantum behavior, is generally stable with respect to time (does not degrade or drift over time) and is largely independent of temperature and a number of other variables.

Having described system 100 and certain of its components, certain observations are now provided in connection with the prior art and for contrast with the example embodiment benefits. First by way of introduction, the Allan deviation (which is the square root of the Allan variance) is a measure of frequency stability of clock signals (e.g., in clocks, oscillators, amplifiers), and in effect is a measure of frequency distribution over a number of samples—hence, the lower the Allan deviation measure, the lower the variance of distribution and the better the performance of the clock signal. Further, the Allan deviation is inversely proportional to both the quality factor (Q) and signal-to-noise ratio (SNR) of the frequency response curve, whether in the prior art, or transceiver 140 in an example embodiment, as it processes the received RX signal response to detect an absorption peak frequency; thus, by increasing one or both of the Q and SNR of the system, the Allan deviation measure is improved. Notably, the prior art can achieve certain improvement in the Allan deviation by reducing pressure within the cell which reduces the width of the transition caused by pressure broadening phenomena, as such an approach will improve Q only down to a certain pressure; however, for pressures below a certain value (e.g., 0.1 mbar), the width cannot be reduced further because of Doppler broadening which is independent of pressure and mostly dependent on the temperature of the gas. However pressure reduction reduces the number of molecules available for interrogation and so reducing the amplitude of the quantum transition signal. In summary an optimum pressure can be found (for water this pressure is approximately 0.1 mbar) where the SNR can be maximized by having the minimum transition width possible and the maximum amplitude possible.

As mentioned above, the prior art endeavors can be susceptible to Doppler broadening, which is an effect caused by the distribution of velocities of atoms/molecules, particularly in response to higher temperatures. Particularly, for atoms having velocities in a same direction as the direction of propagation of the electromagnetic wave, the Doppler effect will cause the transition of the dipolar molecules from the lower energy vibrational state to the higher energy vibrational state to occur when the frequency of the electromagnetic signal is lower than the frequency that corresponds to the energy difference of the two vibrational states (E=h f) (e.g., 183.31 GHz for water), and conversely, for atoms having velocities in an opposing direction as the prior art unidirectional signal, the Doppler effect will cause the rotational transition of those atoms to occur at an excitation frequency that is higher than the intrinsic quantum rotational state transition frequency for the dipole. Thus, the result of Doppler spreading is a wider spectral line when interrogating these atoms/molecules, which accordingly provides less accuracy in identifying a particular frequency of quantum transition.

Figure 4:
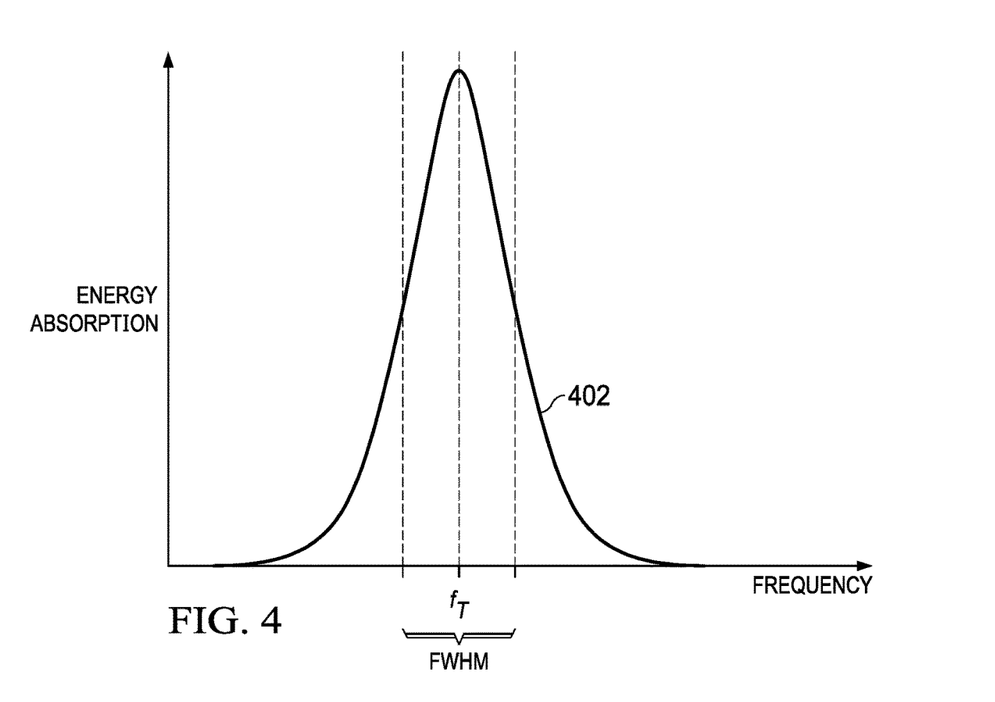
FIG. 4 illustrates a plot of an energy absorption signal in response to an example embodiment clock system.

Reference is now turned to the contrast of example embodiment benefits, particularly in connection with the prior art observations above and the example embodiment implementation which achieves the atomic vector concentration in region 128, as illustrated in FIG. 3B. Specifically, recall the earlier discussion demonstrated the alignment or near alignment of the atomic vector directionality along axis 109, and that axis is perpendicular to the direction D1 of wave propagation through chamber 104. Accordingly, as the propagating wave travels along chamber 104, its interrogation of the atoms in region 128 will be such that Doppler broadening is considerably reduced, as the number of atoms having velocity direction aligned along direction D1, either in the direction of wave propagation or in the exact 180 degree opposite direction, are substantially reduced as compared to a type of velocity distribution in reservoir 110, or elsewhere in cell 102. Accordingly, a larger number of atoms that are unaffected, or substantially unaffected, by the Doppler effect are interrogated by the propagating wave. To further illustrate this effect, FIG. 4 illustrates a plot 402 of the RX energy absorption signal in response to the generally perpendicular incidence of the direction of wave EMW (see, FIG. 3B) with the atoms in region 128, and as a function of frequency, where recall that frequency is swept across a range that is intended to include the intrinsic quantum rotational state transition frequency $f_T$ for the dipole (e.g., 183.31 GHz for water). In general, as the swept frequency approaches the intrinsic quantum rotational state transition frequency, the absorption of energy by the dipolar gas increases as shown, and as detected in the RX signal, creating an absorption spectra that is flatter away from that intrinsic frequency and that ascends from both directions as the frequency sweep nears that intrinsic frequency. Due to the perpendicular incidence of the wave to the atomic velocity vector direction, it is anticipated in connection with some example embodiments that most of the atoms interrogated will transition from one state (e.g., ground) to a higher energy state as the intrinsic quantum rotational state transition frequency $f_T$ is reached. Moreover, and also due to the above-noted perpendicular incidence, Doppler spreading effects are reduced, so the full width at half maximum (FWHM) point in plot 402 is fairly narrow, which otherwise may be described as a response with a high Q. Thus, the example embodiment provides so-called Doppler-free spectroscopy, in that Doppler broadening is no longer an issue under this approach and the benefit is independent of the gas pressure in cell 102. Accordingly, the relatively high Q lowers the Allan deviation of system 100 (and other comparable system described in this document).

Figure 5:
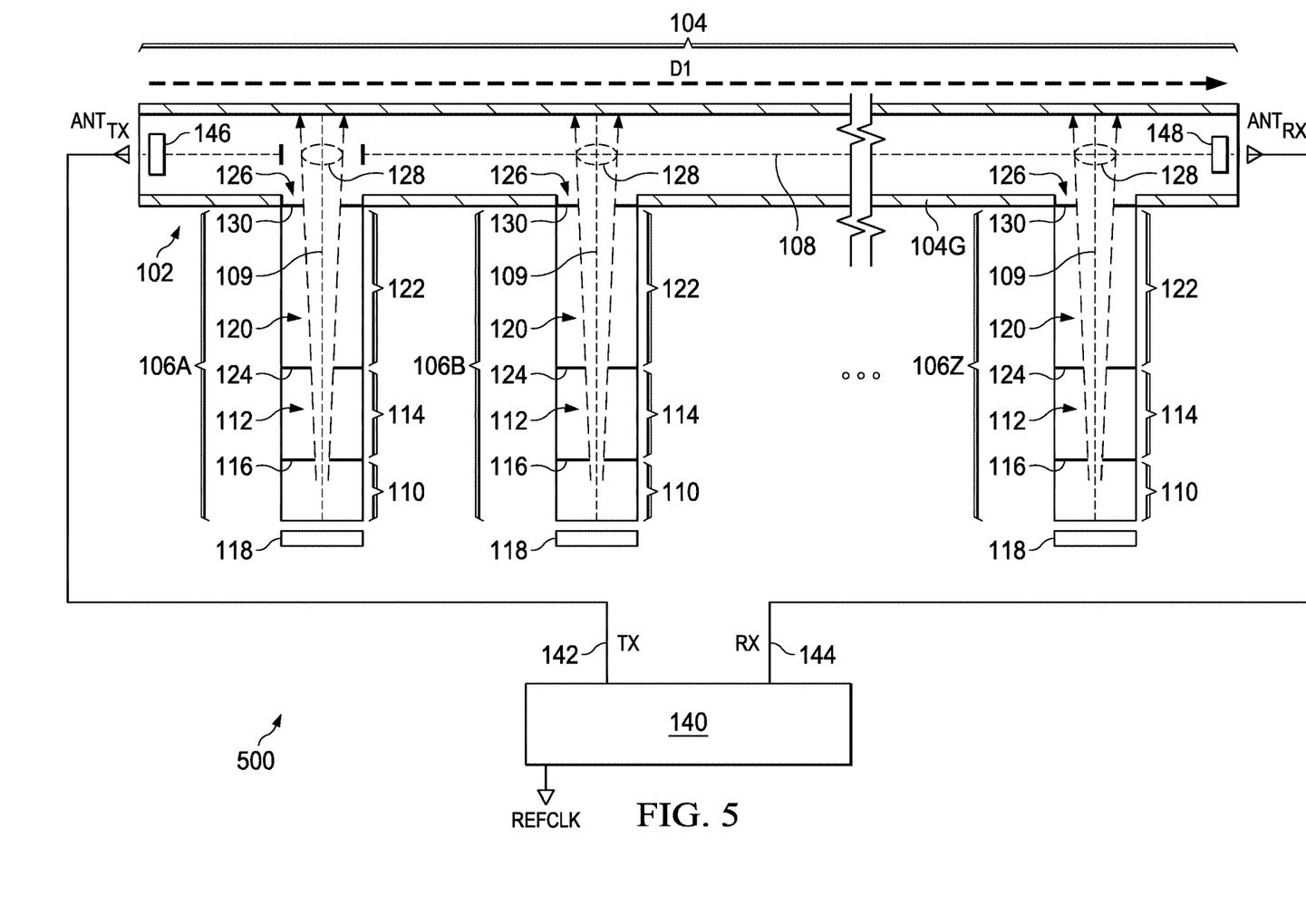
FIG. 5 illustrates a schematic and perspective diagram of another example embodiment clock system.

FIG. 5 illustrates a schematic and perspective diagram of an alternative example embodiment clock system 500, which in various ways should be understood by one skilled in the art given the earlier discussion, and the reader is assumed familiar with that discussion (also, transceiver 140 is shown in a simplified view). Where system 500 differs from system 100 is the inclusion of multiple chambers 106A, 106B, . . . , 106Z, each comparable to chamber 106 of system 100.

Accordingly, each such chamber is in fluid communication with chamber 104, and each includes a reservoir 110 in which dipolar gas is located, one or more velocity direction filter(s) 112, 120, 126, so as to filter atoms from each chamber that is off-axis (non co-linear) relative to axis 108 and urge atoms toward respective regions 128, within chamber 104, whereupon such regions will position atoms having a velocity vector direction aligned, or more closely aligned, with axes 109, that is, generally perpendicular, or near-perpendicular, to axis 108. The operation of system 500 otherwise follows method 300 of FIG. 3, but here the cumulative signal strength (SNR) will be improved because the plural chambers 106A, 106B, . . . 106Z, and respective plural regions 128, provide a greater total number of molecules that are interrogated by the electromagnetic wave as it propagates in direction D1 through chamber 104. Thus, system 500 avails of the same improved (higher) Q factor of system 100, while also improving SNR.

From the above, various example embodiments provide a system generating frequency clock signals from atomic rotational quantum response in a cell using a fluid communicating chambers in which a first chamber filters atoms so that selected atoms are introduced into a directional wave propagating path in a second chamber, and in which the filtered atoms have a velocity vector direction that is perpendicular or near-perpendicular to the directional wave propagating path. Various example embodiments have various respects and/or benefits. For example, Q factor and/or SNR of the system response is improved. As another example, the system may perform well independent of pressure of the (e.g., dipolar) gas stored in the cell. As still another benefit, various alterations have been provided and still others may be ascertained. For example, while heating block 118 is preferred in some examples, note also that the kinetic energy of an atom is larger (e.g., order(s) of magnitude) than the potential energy of gravity, so even without the added energy of heating block 118, the velocity direction filter(s) will cause an electromagnetic wave interrogation of a concentration of atoms with a velocity direction perpendicular to the propagating wave that is greater than that for unfiltered atoms. As another example, while chamber 104 has been shown to be linear, other shapes may be implemented for it (as well as chamber(s) 106), so long as the preferred aspect of filtered atoms according to velocity vector direction are introduced from one chamber to the other, so as to reduce Doppler spreading. As yet another example, while aperture sizes on the order of 1 mm have been provided, different sizes may be selected based on various criteria—one such consideration is SNR tradeoff—a larger diameter aperture will significantly increase the SNR of system 100 because more molecules will interact with the electromagnetic wave, but also the width of the absorption signal as shown in FIG. 3 will be larger (Q-factor will be smaller) because there will be more molecules with velocity vector direction that is not perpendicular to the electromagnetic wave propagation vector; on the other hand, a smaller aperture diameter will result in narrower absorption width (higher Q-factor) because the majority of the molecules will have velocities perpendicular to the electromagnetic wave propagation vector, but also the SNR will be decreased. Accordingly, while various alternatives have been provided according to the disclosed embodiments, still others are contemplated and yet others may be ascertained by one skilled in the art. Given the preceding, one skilled in the art should further appreciate that while some embodiments have been described in detail, various substitutions, modifications or alterations can be made to the descriptions set forth above without departing from the inventive scope, as is defined by the following claims.

The invention claimed is:

1. A clock apparatus, comprising:
a gas cell having first and second chambers, in which:
the first chamber includes a sealed interior, has a first axis along a majority length of the first chamber, and is configured as a signal waveguide to direct an electromagnetic wave along the first axis;
the second chamber is coupled to the first chamber, is configured to direct atoms having a particular velocity vector into the first chamber, and has a second axis along a majority length of the second chamber; and
the particular velocity vector is perpendicular or near-perpendicular to the first axis.

2. The apparatus of claim 1, further comprising:
a dipolar gas inside the gas cell, the dipolar gas configured to pass the electromagnetic wave;
an electromagnetic wave source couple to the first chamber, the electromagnetic wave source configured to provide the electromagnetic wave; and
receiving apparatus configured to detect an amount of energy in the electromagnetic wave after the electromagnetic wave passes through the dipolar gas.

3. The clock apparatus of claim 2, wherein the electromagnetic wave source is configured to provide the electromagnetic wave by:
sweeping a frequency of an energy signal across a range of frequencies; and
responsive to the receiving apparatus detecting a peak energy in the electromagnetic wave, maintaining a frequency of the electromagnetic wave at a frequency corresponding to a frequency at which the peak energy occurred.

4. The clock apparatus of claim 3, wherein the peak energy includes a maximum amount of absorption.

5. The clock apparatus of claim 3, wherein the peak energy includes a minimum amount of transmission.

6. The clock apparatus of claim 2, wherein:
the first chamber has an entrance portion and an exit portion;
the electromagnetic wave source includes a transmit antenna proximate the entrance portion; and
the receiving apparatus includes a receive antenna proximate the exit portion.

7. The clock apparatus of claim 1, wherein the gas cell is formed by one or more layers of a semiconductor wafer.

8. The apparatus of claim 1, wherein the first chamber has one or more getter regions configured to adsorb a dipolar gas inside the first chamber.

9. The apparatus of claim 1, wherein the second chamber includes a velocity filter.

10. The apparatus of claim 9, wherein the velocity filter includes a structure having an aperture formed in the structure.

11. The apparatus of claim 9, wherein:
the velocity filter includes structures having respective apertures formed in the structures; and
the apertures have respective centers aligned with each other.

12. The apparatus of claim 9, wherein the second chamber is configured to apply external energy to the atoms.

13. The apparatus of claim 9, wherein the second chamber is configured to apply heat to the atoms.

14. The apparatus of claim 1, further comprising:
a dipolar gas inside the first and second chambers, in which the dipolar gas in a first portion the first chamber has an isotropic velocity distribution, and the dipolar gas in the second chamber has an anisotropic distribution.

15. The clock apparatus of claim 1, wherein:
the particular velocity vector is a first velocity vector;
the gas cell has a third chamber coupled to the first chamber and configured to direct atoms having a second velocity vector into the first chamber;
the third chamber has a third axis along a majority length of the third chamber, in which the third axis is parallel to the second axis; and
the second velocity vector is perpendicular or near-perpendicular to the first axis.

16. A method of operating a clock apparatus, the clock apparatus including a gas cell having first and second chambers, in which the first chamber includes a sealed interior configured as a signal waveguide, and the second chamber is coupled to the first chamber, the method comprising:
directing atoms having a particular velocity vector from the second chamber into the first chamber, the particular velocity vector is perpendicular or near-perpendicular to a majority axis of the first chamber;
directing an electromagnetic wave to travel along the majority axis of the first chamber via the signal waveguide; and
detecting an amount of energy in the electromagnetic wave after the electromagnetic wave passes through the directed atoms.

17. The method of claim 16, wherein the directed atoms include a dipolar gas.

18. The method of claim 16, wherein:
the directed atoms include dipolar gas atoms inside the gas cell;
a distribution of the dipolar gas in a first portion the first chamber includes an isotropic velocity distribution; and
a distribution of the dipolar gas in the second chamber includes an anisotropic distribution.

* * * * *